(12) United States Patent
Schulter et al.

(10) Patent No.: US 11,518,382 B2
(45) Date of Patent: Dec. 6, 2022

(54) LEARNING TO SIMULATE

(71) Applicant: NEC Laboratories America, Inc., Princeton, NJ (US)

(72) Inventors: Samuel Schulter, New York, NY (US); Nataniel Ruiz, Cupertino, CA (US); Manmohan Chandraker, Santa Clara, CA (US)

(73) Assignee: NEC Corporation

( * ) Notice: Subject to any disclaimer, the term of this patent is extended or adjusted under 35 U.S.C. 154(b) by 479 days.

(21) Appl. No.: 16/696,087

(22) Filed: Nov. 26, 2019

(65) Prior Publication Data

US 2020/0094824 A1 Mar. 26, 2020

Related U.S. Application Data

(63) Continuation of application No. 16/583,862, filed on Sep. 26, 2019, now abandoned.

(Continued)

(51) Int. Cl.
*B60W 30/095* (2012.01)
*G06N 3/08* (2006.01)
(Continued)

(52) U.S. Cl.
CPC ......... *B60W 30/0956* (2013.01); *G06F 30/20* (2020.01); *G06N 3/08* (2013.01);
(Continued)

(58) Field of Classification Search
CPC ..... B60W 2050/0062; B60W 2420/42; B60W 2554/00; B60W 30/0956; B60W 60/0015;
(Continued)

(56) References Cited

U.S. PATENT DOCUMENTS 7,839,292 B2 * 11/2010 Wang .................... B60W 50/14
340/576
10,643,320 B2 * 5/2020 Lee ......................... G06T 5/005
(Continued)

OTHER PUBLICATIONS

Bello et al., "Neural Optimizer Search with Reinforcement Learning", Proceedings of the 34th International Conference on Machine Learning, Aug. 2017, 10 pages.

(Continued)

*Primary Examiner* — Babar Sarwar
(74) *Attorney, Agent, or Firm* — Joseph Kolodka

(57) ABSTRACT

A method is provided for danger prediction. The method includes generating fully-annotated simulated training data for a machine learning model responsive to receiving a set of computer-selected simulator-adjusting parameters. The method further includes training the machine learning model using reinforcement learning on the fully-annotated simulated training data. The method also includes measuring an accuracy of the trained machine learning model relative to learning a discriminative function for a given task. The discriminative function predicts a given label for a given image from the fully-annotated simulated training data. The method additionally includes adjusting the computer-selected simulator-adjusting parameters and repeating said training and measuring steps responsive to the accuracy being below a threshold accuracy. The method further includes predicting a dangerous condition relative to a motor vehicle and providing a warning to an entity regarding the dangerous condition by applying the trained machine learning model to actual unlabeled data for the vehicle.

20 Claims, 7 Drawing Sheets

Related U.S. Application Data

(60) Provisional application No. 62/736,608, filed on Sep. 26, 2018.

(51) Int. Cl.
  *G06F 30/20* (2020.01)
  *G06V 20/56* (2022.01)
  *B60W 50/00* (2006.01)

(52) U.S. Cl.
  CPC ..... *G06V 20/56* (2022.01); *B60W 2050/0062* (2013.01); *B60W 2554/00* (2020.02)

(58) Field of Classification Search
  CPC ....... G06F 30/20; G06F 30/27; G06K 9/6262; G06N 20/00; G06N 3/08; G06N 7/005; G06V 20/56; G06V 20/58
  See application file for complete search history.

(56) References Cited

U.S. PATENT DOCUMENTS

| | | | | |
|---|---|---|---|---|
| 10,657,838 | B2* | 5/2020 | Garnavi | G16H 50/20 |
| 10,970,582 | B2* | 4/2021 | Alletto | G06K 9/6256 |
| 11,055,605 | B2* | 7/2021 | Graf | G06N 3/04 |
| 11,200,883 | B2* | 12/2021 | Li | G10L 15/10 |
| 2009/0040054 | A1* | 2/2009 | Wang | B60W 40/09 |
| | | | | 340/576 |
| 2013/0242284 | A1* | 9/2013 | Zeng | G01S 17/931 |
| | | | | 356/4.01 |
| 2015/0154711 | A1* | 6/2015 | Christopulos | G06Q 30/0201 |
| | | | | 705/7.29 |
| 2017/0098172 | A1* | 4/2017 | Ellenbogen | G06N 7/005 |
| 2017/0286826 | A1* | 10/2017 | Min | G06N 3/0445 |
| 2017/0323179 | A1* | 11/2017 | Vallespi-Gonzalez | G05D 1/0088 |
| 2018/0307967 | A1* | 10/2018 | Graf | G01S 7/417 |
| 2018/0336468 | A1* | 11/2018 | Kadav | G06V 20/17 |
| 2018/0357514 | A1* | 12/2018 | Zisimopoulos | G06V 10/82 |
| 2019/0080206 | A1* | 3/2019 | Hotson | G06K 9/6264 |
| 2021/0110147 | A1* | 4/2021 | Tsai | G06V 10/82 |

OTHER PUBLICATIONS

Fan et al., "Learning to Teach" Published as a conference paper at ICLR 2018, May 2018, pp. 1-16.

Kar et al., "Meta-Sim: Learning to Generate Synthetic Datasets", ICCV papers, Jun. 2019, pp. 1-10.

Pashevich et al., "Learning to Augment Synthetic Images for Sim2Real Policy Transfer", arXiv:1903.07740v2 [cs.LG] Jul. 30, 2019, 7 pages.

Richter et al., "Playing for Data: Ground Truth from Computer Games", Aug. 2016, pp. 1-17.

Richter et al., "Playing for Benchmarks", arXiv:1709.07322, Sep. 2017, pp. 1-10.

Zoph et al., "Neural Architecture Search With Reinforcement Learning", conference paper at ICLR 2017, Apr. 2017, pp. 1-16.

* cited by examiner

LEARNING TO SIMULATE

RELATED APPLICATION INFORMATION

This application This application is a continuation-in-part of U.S. patent application Ser. No. 16/583,862 filed on Sep. 26, 2019 which claims priority to U.S. Provisional Patent Application Ser. No. 62/736,608 filed on Sep. 26, 2018, both incorporated herein by reference in their respective entireties.

BACKGROUND

Technical Field

The present invention relates to computer systems aimed at leveraging simulation data to improve machine learning models like deep neural networks.

Description of the Related Art

Learning from simulated data has been explored in recent years in different works. These works leverage the fact that a simulator can generate abundant data with ground truth annotations for the task at hand, for instance optical flow or semantic segmentation. The simulator typically is a game engine or an animated movie and prior work did not change the way data is being generated.

More related from the technical aspect, are works that can also be considered as meta-learning but address different problems. One prior work uses reinforcement learning to automatically find better neural network architectures, while another prior work is more general in that it learns several hyper parameters of a machine learning algorithm. The prior work tries to optimize the use of data, but learn a selection process for already existing data. In contrast, our approach directly operates the data simulation engine, which is more flexible.

SUMMARY

According to an aspect of the present invention, a computer-implemented method is provided for danger prediction. The method includes generating, by a hardware processor, fully-annotated simulated training data for a machine learning model responsive to receiving a set of computer-selected simulator-adjusting parameters. The method further includes training, by the hardware processor, the machine learning model using reinforcement learning on the fully-annotated simulated training data. The method also includes measuring, by the hardware processor, an accuracy of the trained machine learning model relative to learning a discriminative function for a given task. The discriminative function predicts a given label for a given image from the fully-annotated simulated training data. The method additionally includes adjusting, by the hardware processor, the computer-selected simulator-adjusting parameters and repeating said training and measuring steps responsive to the accuracy being below a threshold accuracy. The method further includes predicting, by the hardware processor, a dangerous condition relative to a motor vehicle and providing a warning to an entity regarding the dangerous condition by applying the trained machine learning model to actual unlabeled data for the motor vehicle.

According to another aspect of the present invention, a computer program product is provided for danger prediction. The computer program product includes a non-transitory computer readable storage medium having program instructions embodied therewith. The program instructions are executable by a computer to cause the computer to perform a method. The method includes generating, by a hardware processor, fully-annotated simulated training data for a machine learning model responsive to receiving a set of computer-selected simulator-adjusting parameters. The method further includes training, by the hardware processor, the machine learning model using reinforcement learning on the fully-annotated simulated training data. The method also include measuring, by the hardware processor, an accuracy of the trained machine learning model relative to learning a discriminative function for a given task. The discriminative function predicts a given label for a given image from the fully-annotated simulated training data. The method additionally includes adjusting, by the hardware processor, the computer-selected simulator-adjusting parameters and repeating said training and measuring steps responsive to the accuracy being below a threshold accuracy. The method further includes predicting, by the hardware processor, a dangerous condition relative to a motor vehicle and providing a warning to an entity regarding the dangerous condition by applying the trained machine learning model to actual unlabeled data for the motor vehicle.

According to yet another aspect of the present invention, a computer processing system is provided for determining command-to-process correspondence. The system includes a memory device including program code stored thereon. The system further includes a hardware processor, operatively coupled to the memory device, and configured to run the program code stored on the memory device to generate fully-annotated simulated training data for a machine learning model responsive to receiving a set of computer-selected simulator-adjusting parameters. The hardware processor is further configured to run the program code to train the machine learning model using reinforcement learning on the fully-annotated simulated training data. The hardware processor is also configured to run the program code to measure an accuracy of the trained machine learning model relative to learning a discriminative function for a given task. The discriminative function predicts a given label for a given image from the fully-annotated simulated training data. The hardware processor additionally configured to run the program code to adjust the computer-selected simulator-adjusting parameters and repeating said training and measuring steps responsive to the accuracy being below a threshold accuracy. The hardware processor is further configured to run the program code to predict a dangerous condition relative to a motor vehicle and providing a warning to an entity regarding the dangerous condition by applying the trained machine learning model to actual unlabeled data for the motor vehicle.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

This invention aims at leveraging simulation data to improve machine learning models like deep neural networks. But the invention not only generates a large corpus of simulated data, but automatically learns what type of data needs to be generated such that the machine learning model improves on some target task.

In particular, we define a set of parameters that adjust the simulator and consequently define the type of data being generated. The proposed model can be considered as a meta-learning approach that tries to adjust these parameters in order to generate better data for the actual machine learning problem. The following figure illustrates the basic concept with the example of danger prediction in road scenes for advanced driver assistance systems.

Figure 1:
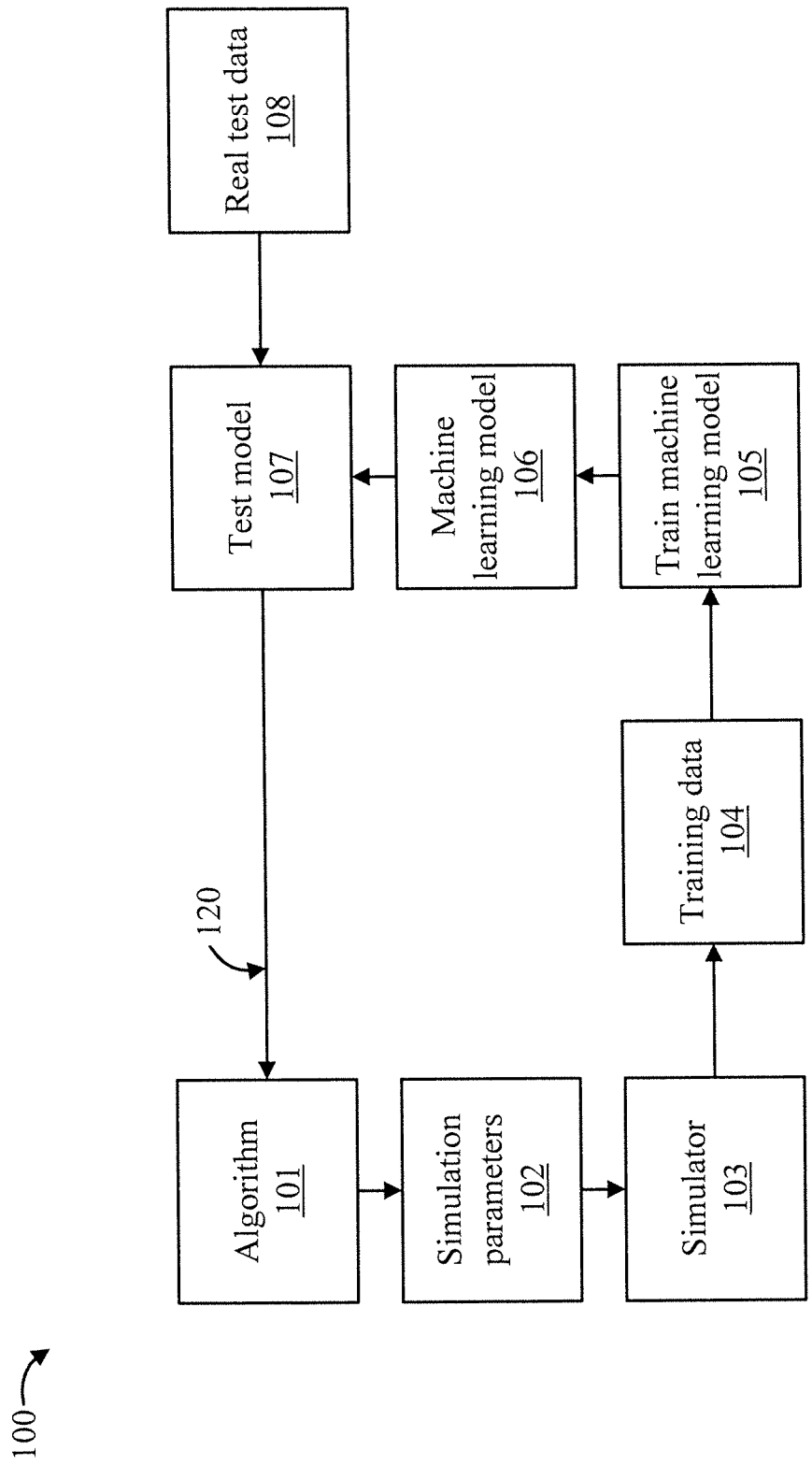
FIG. 1 shows a block diagram of an exemplary system, in accordance with an embodiment of the present invention.

FIG. 1 is a block diagram showing an exemplary architecture, in accordance with an embodiment of the present invention.

The architecture involves an algorithm 101, simulation parameters 102, a simulator 103, training data 104, a training machine learning model block 105, a machine learning model 106, a test model 107, real test data 108, and accuracy 120 of the model on the real test data.

Figure 2:
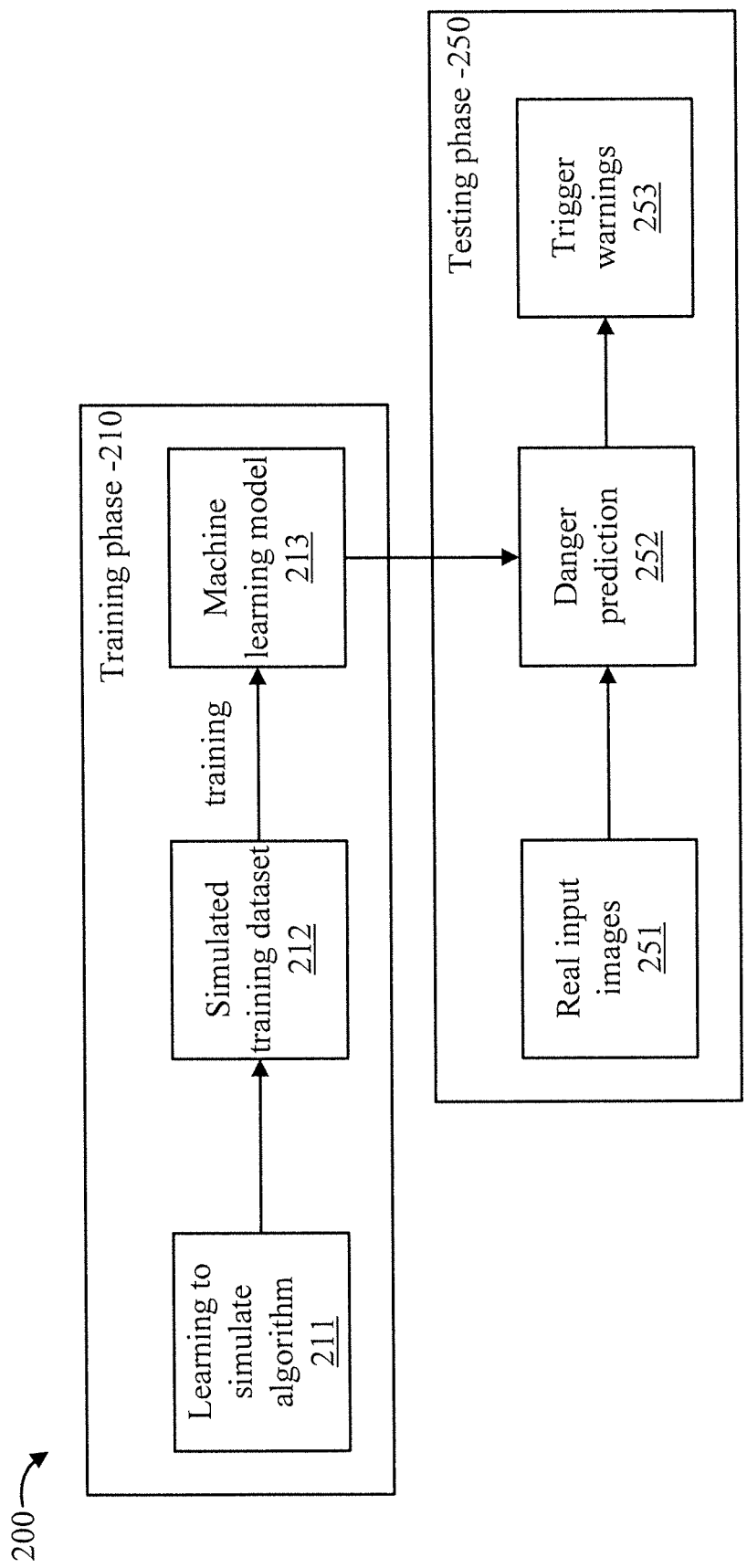
FIG. 2 shows a block diagram of an aspect of the invention, in accordance with an embodiment of the present invention.

FIG. 2 is a block diagram showing an exemplary training phase 210 and an exemplary testing phase 250, in accordance with an embodiment of the present invention.

The training phase 210 involves a learning to simulate algorithm 211, a simulated training dataset 212, and a machine learning model 213.

The testing phase 250 involves real input images 251, a danger prediction 252, and a trigger warnings block 253.

As can be seen from FIG. 1 and FIG. 2, the simulator 103 takes parameters as input that are automatically chosen by our proposed algorithm 101. The simulator 103 generates fully-annotated training data for a machine learning model 106. The accuracy of the trained machine learning model 106 on a pre-defined real data set is the signal to our proposed algorithm 101 to further adjust the simulator parameters 102. These steps are repeated until the performance of the machine learning model 106 on the pre-defined real data set 108 saturates.

The concrete application of danger prediction 252 in driving scenarios for driver assistance systems is particularly suitable for our proposed algorithm 101, because real training data of dangerous driving scenes or actual accidents is hard (and actually improper) to acquire at a large scale for obvious reasons. A schematic illustration of such an application is shown in FIG. 2. During the training phase 210, our proposed algorithm generates an expressive data set of dangerous situations in simulation, which is used to train a machine learning model. At test time 250, the machine learning model 213 is applied on real data to perform danger prediction.

While we demonstrate the concept of "learning to simulate" 211 with the example of danger prediction 252, the approach is very general and can be applied to many other applications.

Let f be a function that predicts labels y from a given input x and can be trained by providing many (x,y) pairs. This function can be a deep neural network and the data x and y can be RGB images and semantic segmentation masks. A simulator 103 can generate (x,y) pairs following some distribution p(x,y; z), where z are the parameters of this distribution. Typically, the parameters z are hard to quantify and are implicitly defined by the code of the simulator 103 itself or the operator of the simulator 103. Imagine the simulator being a game engine where the operator plays the game and each simulated frame serves as (x,y) pair.

The goal of our approach is to find parameters z that generate (x,y) pairs such that the function f learned with this data achieves high accuracy on some task, e.g., on (x,y) test pairs that have not been seen before or are actually coming from real data, e.g., a real camera.

Since the rendering engine is typically not differentiable, directly applying gradient-based methods to this problem fails. Instead, we use a stochastic gradient approximation technique, REINFORCE or policy gradients, to estimate a training signal for the parameters z. This algorithm requires a reward R that describes how good the generated pairs of data (x,y) were with the current value of z. In our case, we define the reward R as a measure of accuracy of the function f on a held-out validation set (e.g., separately simulated data or real data).

In one iteration of the algorithm, the current state of the parameters z are handed to the simulator, which uses this to parametrize the data generating distribution p(x,y;z). The simulator generates pairs of data (x,y) which are influenced by z. The function f is trained with the generated and labeled data (x,y) and is evaluated on a held-out set of data to receive a reward R. The reward R is used in the REINFORCE or policy gradient algorithm to compute a training signal for z. The parameters z are updated and the algorithm goes to the next iteration. The algorithm stops after a pre-defined maximum number of iterations or if the reward R or the scene parameters z converge.

Figure 3:
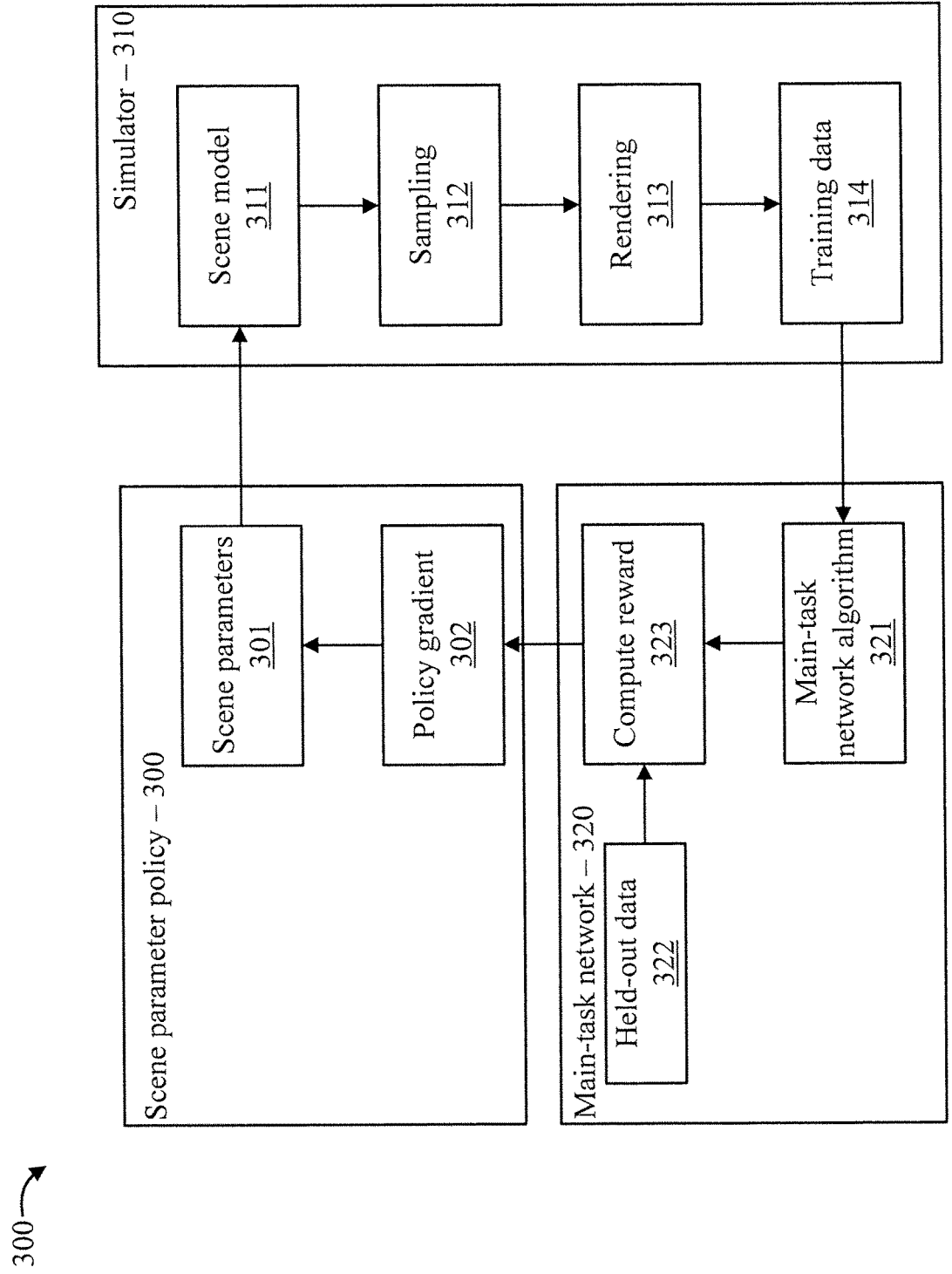
FIG. 3 shows a block diagram of another aspect of the invention, in accordance with an embodiment of the present invention.

Referring now to FIG. 3.

300—Scene parameter policy:

301—Scene parameters:

The scene parameters 301 define the parameters of the probability distributions for generating scenes. For instance, one probability distribution can describe the number of objects being generated in the scene. Another one can describe the topology of the road intersection (T-intersection, 4-way intersection, etc.).

302—Policy-gradient:

Policy gradient 302 is the method that, given a reward signal from block 323 (described later), updates the scene parameters in a way to achieve higher reward in the next iteration. Updating the scene parameters just means to update the probability distribution's parameters. For instance, to make it more likely to generate more objects.

310—Simulator:

311—Scene model:

The scene model 311 is a composition of various probability distributions into a graphical model that describes certain types of scenes. For instance, in a driving scenario, the scene model 311 describes the topology of the intersection, the number of lanes, the number of objects in the scene, the existence of sidewalks or buildings, etc. The scene model 311 also defines the type of probability distribution for each of these attributes, e.g., Gaussian, discrete, Poisson, etc. The scene parameters (block 301) define the shape of these probability distributions, e.g., the mean and variance of a Gaussian.

312—Sampling:

The simulator 310 uses ancestral sampling to generate one particular instance of a scene from the probability distribution defined by the scene model (311) and the scene parameters (301). In our road scene example, one instance (or sample) means that one particular road topology and a specific number of objects has been chosen. Sampling 312 can be repeated as often as required and each outcome will likely be different. This information is handed over to the actual rendering engine.

313—Rendering:

Given the descriptions of the scene, i.e., the outcome of the sampling process in block 312, the rendering engine 313 generates a set of RGB images and the corresponding annotations. As described above, this is the set of (x,y) data pairs used for training the main-task network (320). The annotation takes different forms, depending on the task at hand. For instance, for semantic segmentation, the annotation is a category for each pixel. The rendering engine is a non-differentiable process.

314—Training data:

The outcome of the rendering engine is a set of data-annotation pairs (x,y). Typically, x is an RGB image and y is the annotation used for the current task at hand. This set of pairs defines the training data 314 for the main-task network in block 320. We explore different strategies for aggregating training data over multiple iterations. One extreme is to only use the newly generated data. Another extreme would be to define the training data 314 as the union of all data generated by the simulator in all iterations. Our method is not restricted to any side of these extremes and many variants are possible to aggregate the data over the iterations.

320—Main-task network:

321—Main-task network algorithm:

This is a machine learning algorithm that is addressing the main task that should be solved. It is trained with the training data provided by the simulator (block 314). Our approach is not restricted to any particular machine learning algorithm, but we are using neural networks for our tasks. This machine learning algorithm learns a function f that predicts y given input x.

322—Held-out data:

The held-out data 322 is a set of (x,y) pairs that is used to evaluate the current accuracy of the main-task network (block 301). The held-out data 322 is prepared once from the simulator with a fixed set of scene parameters or, more importantly, comes from real-world data.

323—Compute reward:

In order to provide a training signal about how to update the scene parameters, a reward 323 is required for the current set of scene parameters. The reward 323 is obtained by evaluating the main-task network (trained on the current set of training data) on the held-out data (322). Depending on the task, different metrics may be used to define the quality of the main-task network and, thus, implicitly the quality of the training data and the underlying scene parameters. We directly use these task-dependent metrics as a reward signal, which is forwarded to the policy-gradient updates (block 302).

The advantages of the invention are as follows:

By learning how to adjust the simulator's parameters, data can be generated more effectively in a sense that it is more useful for the actual machine learning algorithm that is being trained and then deployed. This means that eventually less data is required to properly train the model, which reduces computational costs.

Being able to adjust the simulator's parameters allows us to simulate very rare scenarios like traffic accidents. This type of data is very hard or even impossible to collect in real scenes at a large enough scale to being able to train models. This is clearly an advantage to learn better models for rare scenarios, which typically are the most important scenarios.

Simulated data can also be combined with existing real data to build better models. But it is important to receive complementary information from the simulator, which can be automated with our approach.

The inventive aspect of the present invention involves adapting the underlying data distribution to generate training data. Prior work always assumes that the underlying data distribution is fixed and unknown. The novelty in our work is that we relax this assumption and leverage simulation engines to show the benefit of adapting the data distribution to the needs of the actual machine learning algorithm, i.e., the main-task network.

The scene parameters and the scene model (blocks 301 and 311):

We define a model for driving scenes and the corresponding parameters to being able to sample from that distribution and render scenes accordingly.

The key step that enables benefits over prior art is to relax the assumption that the data-generating distribution is fixed and unknown. We explicitly model this distribution in a way that directly benefits the actual machine learning task.

Figure 4:
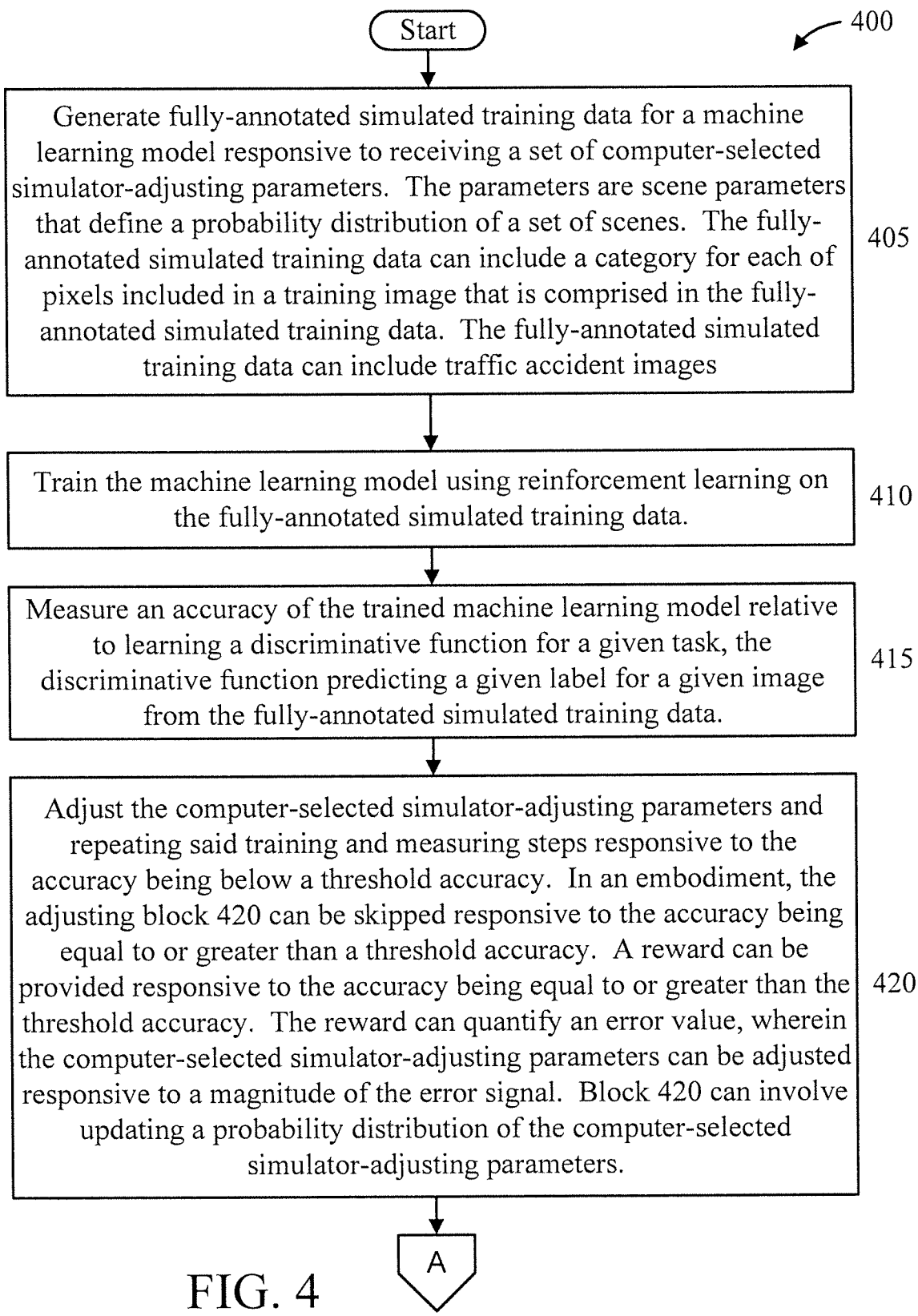
FIGS. 4-5 show flow diagrams of a method, in accordance with an embodiment of the present invention.
Figure 5:
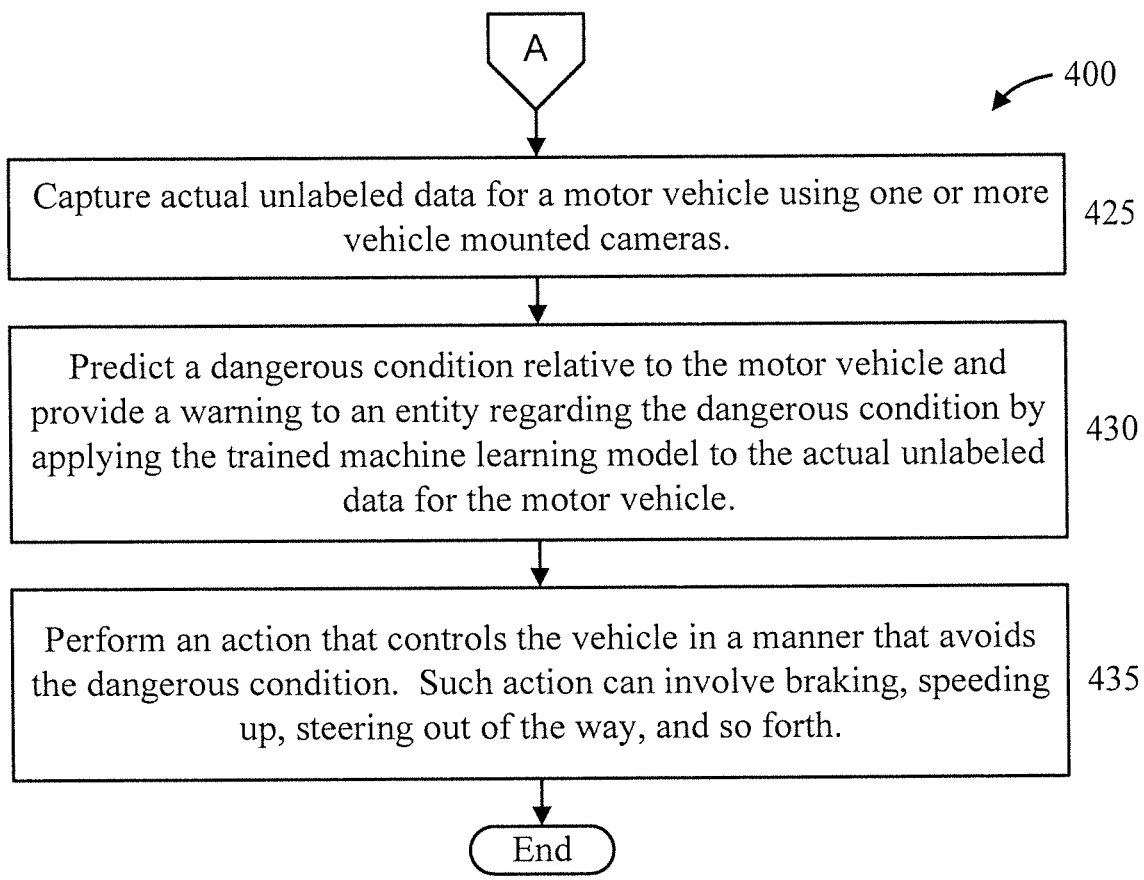

FIGS. 4-5 are flow diagrams showing an exemplary method, in accordance with an embodiment of the present invention.

At block 405, generate fully-annotated simulated training data for a machine learning model responsive to receiving a set of computer-selected simulator-adjusting parameters. In an embodiment, the parameters are scene parameters that define a probability distribution of a set of scenes. In an embedment, (i) a number of training epochs and/or (ii) a dataset size in each of a plurality of policy iterations corresponding to the generating, training, and measuring steps is defined as a respective one(s) of the computer-selected simulator-adjusting parameters. In an embodiment, the fully-annotated simulated training data can include a category for each of pixels included in a training image that is comprised in the fully-annotated simulated training data. In an embodiment, the fully-annotated simulated training data can include traffic accident images.

At block 410, train the machine learning model using reinforcement learning on the fully-annotated simulated training data.

At block 415, measure an accuracy of the trained machine learning model relative to learning a discriminative function for a given task, the discriminative function predicting a given label for a given image from the fully-annotated simulated training data.

At block 420, adjust the computer-selected simulator-adjusting parameters and repeating said training and measuring steps responsive to the accuracy being below a threshold accuracy. In an embodiment, the threshold accuracy can be derived from the reward (e.g., R-b, where R is the reward and b is a baseline as described further herein). In an embodiment, the adjusting block 420 can be skipped responsive to the accuracy being equal to or greater than a threshold accuracy. In an embodiment, a reward can be provided responsive to the accuracy being equal to or greater than the threshold accuracy. In an embodiment, the reward can quantify an error value, wherein the computer-selected simulator-adjusting parameters can be adjusted responsive to a magnitude of the error signal. In an embodiment, block 420 can involve updating a probability distribution of the computer-selected simulator-adjusting parameters.

At block 425, capture actual unlabeled data for a motor vehicle using one or more vehicle mounted cameras.

At block 425, predict a dangerous condition relative to the motor vehicle and provide a warning to an entity regarding the dangerous condition by applying the trained machine learning model to the actual unlabeled data for the motor vehicle.

At block 430, perform an action that controls the vehicle in a manner that avoids the dangerous condition. Such action can involve braking, speeding up, steering out of the way, and so forth.

A further description will now be given regarding various aspects of the present invention, in accordance with an embodiment of the present invention.

The present invention proposes to automatically determine simulation parameters such that the performance of a model trained on synthesized data is maximized. Traditional approaches seek simulation parameters that try to model a distribution that resembles real data as closely as possible, or generate enough volume to be sufficiently representative. By learning the best set of simulation parameters to train a model, we depart from the above in three crucial ways. First, the need for laborious human expertise to create a diverse training dataset is eliminated. Second, learning to simulate may allow generating a smaller training dataset that achieves similar or better performances than random or human-synthesized datasets, thereby saving training resources. Third, it allows questioning whether mimicking real data is indeed the best use of simulation, since a different distribution might be optimal for maximizing a test-time metric (for example, in the case of events with a heavy-tailed distribution).

More formally, a typical machine learning setup aims to learn a function $h_\theta$ that is parameterized by $\theta$ and maps from domain x to range y given training samples $(x, y) \sim p(x, y)$. Data x usually arises from a real world process (for instance, someone takes a picture with a camera) and labels y are often annotated by humans (someone describing the content of that picture). The distribution $p(x, y)$ is assumed unknown and only an empirical sample $D=\{(x_i, y_i)\}_{i=1}^{N}$ is available. The simulator attempts to model a distribution $q(x, y; \psi)$. In prior works, the aim is to adjust the form of q and parameters $\psi$ to mimic p as closely as possible. In this work, we attempt to automatically learn the parameters of the simulator $\psi$ such that the loss of a machine learning model $h_\theta$ is minimized over some validation data set $D_{val}$. This objective can be formulated as the bi-level optimization problem $$\psi^* = \underset{\psi}{\mathrm{argmin}} \sum_{(x,y) \in D_{val}} \mathcal{L}(y, h_\theta(x; \theta^*(\psi))) \quad (1a)$$

$$\mathrm{s.t.} \quad \theta^*(\psi) = \underset{\theta}{\mathrm{argmin}} \sum_{(x,y) \in D_{q(x,y|\psi)}} L(y, h_\theta(x, \theta)) \quad (1b)$$

where $h_\theta$ is parameterized by model parameters $\theta$, $D_q(x,y| \psi)$ describes a data set generated by the simulator and $\theta(\psi)$ denotes the implicit dependence of the model parameters $\psi$ on the model's training data and consequently, for synthetic data, the simulation parameters $\psi$. We focus on the actual data generation process $q(x, y; \psi)$ and are not limited to selecting subsets of existing data. In our formulation, the upper-level problem (equation 1a) can be seen as a meta-learner that learns how to generate data (by adjusting $\psi$) while the lower-level problem (equation 1b) is the main task model (MTM) that learns to solve the actual task at hand. Hereinafter, we describe an approximate algorithm based on policy gradients to optimize the objective. For our algorithm to interact with a black-box simulator, we also present an interface between our model's output $\psi$ and the simulator input.

Given a simulator that samples data as $(x, y) \sim q(x, y; \psi)$, our goal is to adjust $\psi$ such that the MTM $h_\theta$ trained on that simulated data minimizes the risk on real data $(x, y) \sim p(x, y)$. Assume we are given a validation set from real data $D_{val}$ and we can sample synthetic datasets $D_q(x,y \psi) \sim q(x, y \psi)$. Then, we can train $h_\theta$ on $D_q(x,y \psi)$ by minimizing equation 1b.

Note the explicit dependence of the trained model parameters $\theta^*$ on the underlying data generating parameters $\psi$ in equation 1b. To find $\psi^*$, we minimize the empirical risk over the held-out validation set $D_{val}$, as defined in equation 1a. Our desired overall objective function can thus be formulated as the bi-level optimization problem (equations 1a and 1b) in equation 1.

Attempting to solve it with a gradient-based approach poses multiple constraints on the lower-level problem 1b like smoothness, twice differentiability and an invertible Hessian. For our case, even if we choose the model $h_\theta$ to fulfill these constraints, the objective would still be non-differentiable as we (i) sample from a distribution that is parameterized by the optimization variable and (ii) the underlying data generation process (e.g., an image rendering engine) is assumed non-differentiable for the sake of generality of our approach. In order to cope with the above defined objective, we resort to policy gradients to optimize $\psi$.

Our goal is to generate a synthetic dataset such that the main task model (MTM) $h_\theta$, when trained on this dataset until convergence, achieves maximum accuracy on the test set. The test set is evidently not available during train time. Thus, the task of our algorithm is to maximize MTM's performance on the validation set by generating suitable data. Similar to reinforcement learning, we define a policy $\pi_\omega$ parameterized by $\omega$ that can sample parameters $\psi \sim \pi_\omega$ for the simulator. The simulator can be seen as a generative model $G(x, y; \psi)$ which generates a set of data samples (x, y) conditioned on $\psi$. We provide more details on the interface between the policy and the data generating function hereinafter.

Figure 6:
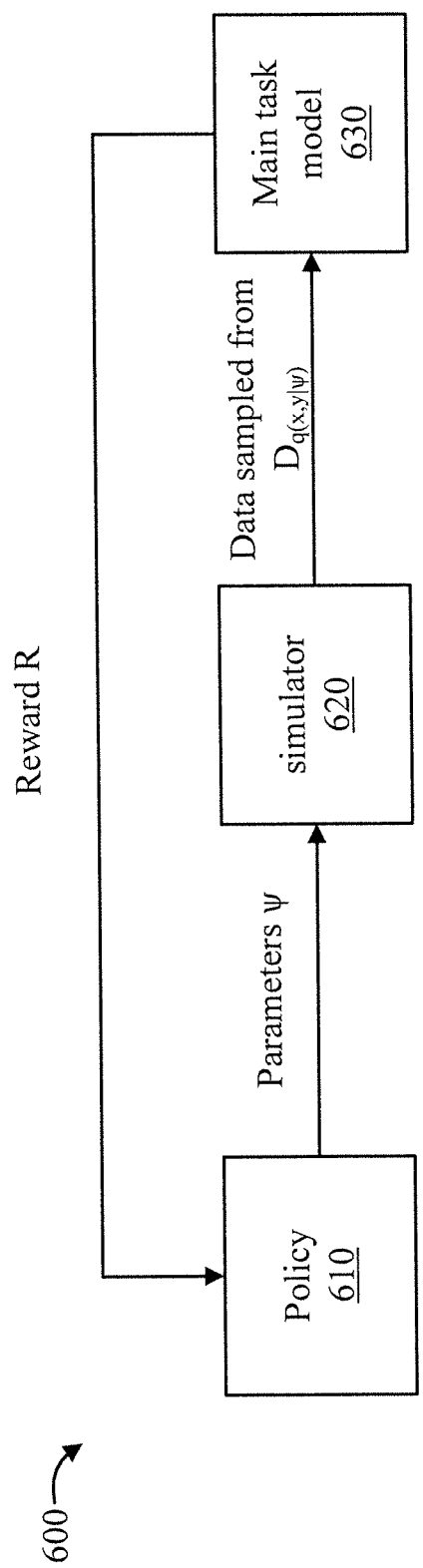
FIG. 6 shows a block diagram of a learning to simulate approach, in accordance with an embodiment of the present invention.

FIG. 6 is a block diagram showing a high-level overview of a learning to simulate approach, in accordance with an embodiment of the present invention.

A policy $\pi_\omega$ 610 outputs parameters $\psi$ which are used by a simulator 620 to generate a training dataset. The main task model (MTM) 630 is then trained on this dataset and evaluated on a validation set. The obtained accuracy serves as reward signal R for the policy on how good the synthesized dataset was. The policy 610 thus learns how to generate data to maximize the validation accuracy.

The policy 610 receives a reward that we define based on the accuracy of the trained MTM 630 on the validation set.

Specifically, we want to maximize the objective as follows $$J(\omega) = E_{\psi \sim \pi_\omega}[R] \quad (2)$$

with respect to $\omega$. The reward R is computed as the negative loss or some other accuracy metric on the validation set. Following the REINFORCE rule, we obtain gradients for updating $\omega$ as follows $$\nabla_\omega J(\omega) = E_{\psi \sim \pi_\omega}[\nabla_\omega \log(\pi_\omega) R(\psi)] \quad (3)$$

An unbiased, empirical estimate of the above quantity is as follows:

$$\mathcal{L}(\omega) = \frac{1}{K} \sum_{k=1}^{K} \nabla \omega \log(\pi_\omega) \hat{A}_k, \quad (4)$$

where $\hat{A}_k = R(\psi_k) - b$ is the advantage estimate and b is a baseline that we choose to be an exponential moving average over previous rewards. In this empirical estimate, K is the number of different datasets $D_{q(x,y|\psi_k)}$ sampled in one policy optimizing batch and $R(\psi_k)$ designates the reward obtained by the k-th MTM trained until convergence.

Given the basic update rule for the policy $\pi_\omega$, we can design different variants of our algorithm for learning to simulate data by introducing three control knobs. First, we define the number of training epochs $\xi$ of the MTM in each policy iteration as a variable. The intuition is that a reasonable reward signal may be obtained even if MTM is not trained until full convergence, thus reducing computation time significantly. Second, we define the size M of the data set generated in each policy iteration. Third, we either choose to retain the MTM parameters $\theta$ from the previous iteration and fine-tune on the newly created data or we estimate $\theta$ from scratch (with a random initialization). This obviously is a trade-off because by retaining parameters the model has seen more training data in total but, at the same time, may be influenced by suboptimal data in early iterations. Algorithm 1 summarizes our learning to simulate approach.

---

Algorithm 1

--- for iteration=1,2,... do
    Use policy $\pi_\omega$ to generate K model parameters $\psi_k$
    Generate K datasets $D_{q(x,y|\psi_k)}$ of size M each
    Train or fine-tune K main task models (MTM) for $\xi$ epochs on data provided by $M_k$
    Obtain rewards $R(\psi_k)$, i.e., the accuracy of the trained MTMs on the validation set
    Compute the advantage estimate $\hat{A}_k = R(\psi_k) - b$
    Update the policy parameters $\omega$ via equation 4
end

---

We defined a general black-box simulator as a distribution $G(x, y|\psi)$ over data samples $(x, y)$ parameterized by $\psi$. In practice, a simulator is typically composed of a deterministic "rendering" process and a sampling step as $G(x, y |\psi) = R (S(\rho|\psi), P(\varphi|\psi))$, where the actual data description $\rho$ (e.g., what objects are rendered in an image) is sampled from a distribution S parametrized by the provided simulation parameters $\psi$ and specific rendering settings $\varphi$ (e.g., lighting conditions) are sampled from a distribution P also parameterized by $\psi$. To enable efficient sampling (via ancestral sampling), the data description distribution is often modeled as a Bayesian network (directed acyclic graph) where $\psi$ defines the parameters of the distributions in each node, but more complex models are possible too.

The interface to the simulator is thus $\psi$ which describes parameters of the internal probability distributions of the black-box simulator. Note that $\psi$ can be modeled as an unconstrained continuous vector and still describe various probability distributions. For instance, a continuous Gaussian is modeled by its mean and variance. A K-dimensional discrete distribution is modeled with K real values. We assume the black-box normalizes the values to a proper distribution via a softmax.

With this convention all input parameters to the simulator are unconstrained continuous variables. We thus model our policy as the multivariate Gaussian $\pi_\omega(\rho, \psi) = \mathcal{N}(\omega, \sigma^2)$ with as many dimensions as the sum of the dimensions of parameters $\rho$ and $\psi$. For simplicity, we only optimize for the mean and set the variance to 0.05 in all cases, although the policy gradients defined above can handle both. Note that our policy can be extended to a more complicated form, e.g., by including the variance.

Figure 7:
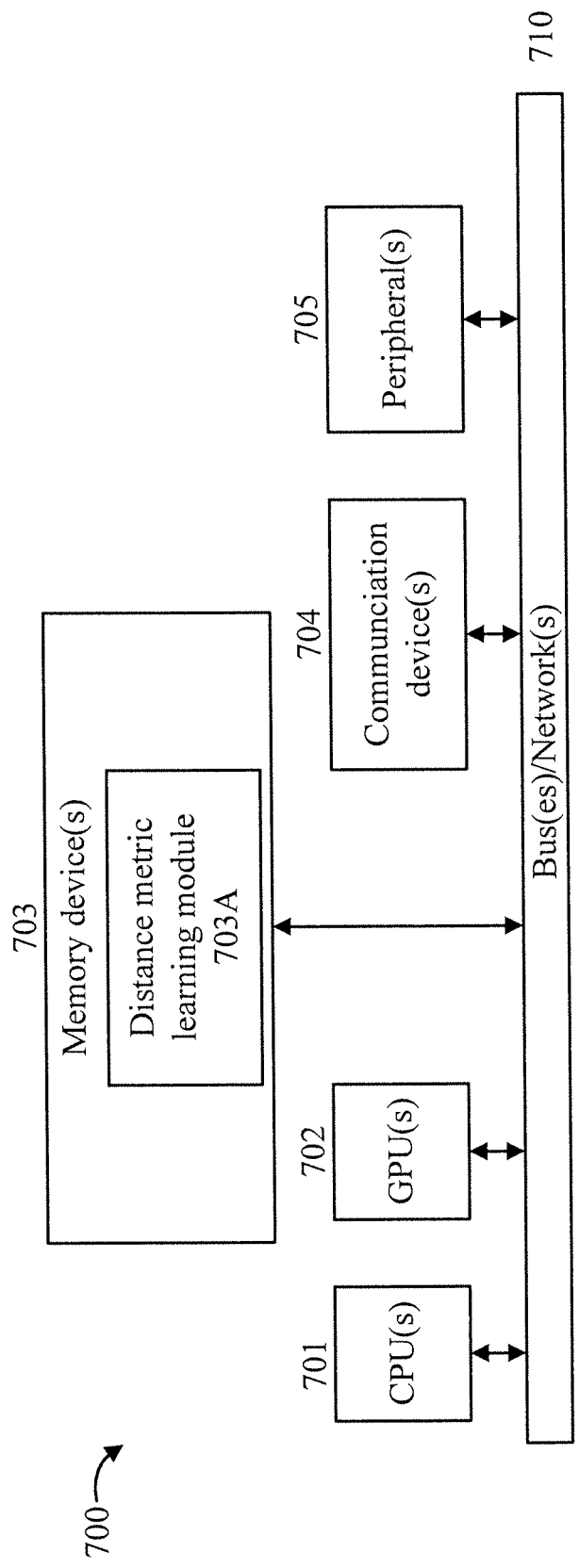
FIG. 7 shows a block diagram of a computer processing system, in accordance with an embodiment of the present invention.

FIG. 7 is a block diagram showing an exemplary processing system 700, in accordance with an embodiment of the present invention. The processing system 700 includes a set of processing units (e.g., CPUs) 701, a set of GPUs 702, a set of memory devices 703, a set of communication devices 704, and set of peripherals 705. The CPUs 701 can be single or multi-core CPUs. The GPUs 702 can be single or multi-core GPUs. The one or more memory devices 703 can include caches, RAMs, ROMs, and other memories (flash, optical, magnetic, etc.). The communication devices 704 can include wireless and/or wired communication devices (e.g., network (e.g., WIFI, etc.) adapters, etc.). The peripherals 705 can include a display device, a user input device, a printer, an imaging device (e.g., a RGBD imaging device, etc.), a microphone, a speaker, and so forth. Elements of processing system 700 are connected by one or more buses or networks (collectively denoted by the figure reference numeral 710).

In an embodiment, memory devices 703 can store specially programmed software modules to transform the computer processing system into a special purpose computer configured to implement various aspects of the present invention. In an embodiment, special purpose hardware (e.g., Application Specific Integrated Circuits, Field Programmable Gate Arrays (FPGAs), and so forth) can be used to implement various aspects of the present invention.

In an embodiment, the memory devices 703 can store code for implementing one or more of the following: distance metric learning module 703A. These and other elements described herein can be implemented at least in part by memory devices 703.

Of course, the processing system 700 may also include other elements (not shown), as readily contemplated by one of skill in the art, as well as omit certain elements. For example, various other input devices and/or output devices can be included in processing system 700, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. Further, in another embodiment, a cloud configuration can be used. These and other variations of the processing system 700 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 700.

As used herein, the term "hardware processor subsystem" or "hardware processor" in short refers to a processor, memory, and software combination that cooperate to perform one or more specific tasks. In an embodiment, the hardware processor subsystem can include one or more data processing elements (e.g., logic circuits, etc.). In an embodiment, the one or more data processing elements can be included in a central processing unit, a graphics processing unit, and/or a separate processor or computing element-based (e.g., logic gates, etc.) controller. In an embodiment, the hardware processor subsystem can include one or more on-board memories (e.g., caches). In an embodiment, the hardware processor subsystem can include one or more other memories (e.g., ROM, RAM, BIOS). In an embodiment, the hardware processor subsystem can include and execute one or more software applications. In an embodiment, the one or more software applications can include the operating system and/or one or more other applications and/or specific code to achieve a specified result. These and other variations of a hardware processor subsystem are readily determined given the teachings of the present invention provided herein.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. However, it is to be appreciated that features of one or more embodiments can be combined given the teachings of the present invention provided herein.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended for as many items listed.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method for danger prediction, comprising:
   generating, by a hardware processor, fully-annotated simulated training data for a machine learning model responsive to receiving a set of computer-selected simulator-adjusting parameters, the fully-annotated simulated training data including a category for each of pixels included in training images included in the fully-annotated simulated training data;
   training, by the hardware processor, the machine learning model using reinforcement learning on the fully-annotated simulated training data;
   measuring, by the hardware processor, an accuracy of the trained machine learning model relative to learning a discriminative function for a given task, the discriminative function predicting a given label for a given image from the fully-annotated simulated training data;
   adjusting, by the hardware processor, the computer-selected simulator-adjusting parameters and repeating said training and measuring steps responsive to the accuracy being below a threshold accuracy; and
   predicting, by the hardware processor, a dangerous condition relative to a motor vehicle and providing a warning to an entity regarding the dangerous condition by applying the trained machine learning model to actual unlabeled data for the motor vehicle.

2. The computer-implemented method of claim 1, further comprising capturing the actual data using one or more vehicle mounted cameras.

3. The computer-implemented method of claim 1, wherein said adjusting step is skipped responsive to the accuracy being equal to or greater than a threshold accuracy.

4. The computer-implemented method of claim 3, wherein a reward is provided responsive to the accuracy being equal to or greater than the threshold accuracy.

5. The computer-implemented method of claim 4, wherein the reward quantifies an error value, wherein the computer-selected simulator-adjusting parameters are adjusted responsive to a magnitude of the error signal.

6. The computer-implemented method of claim 1, wherein the parameters are scene parameters that define a probability distribution of a set of scenes.

7. The computer-implemented method of claim 1, wherein said adjusting step comprising updating a probability distribution of the computer-selected simulator-adjusting parameters.

8. The computer-implemented method of claim 1, wherein the simulator comprises a scene model implemented as a composition of various scene probability distributions in a graphical model.

9. The computer-implemented method of claim 8, wherein the graphical model comprises a vehicle path topology comprising a number of lanes, a number of objects in the scene, sidewalks, and landmarks.

10. The computer-implemented method of claim 8, wherein the graphical model indicates types of the various scene probability distributions.

11. The computer-implemented method of claim 1, wherein the fully- annotated simulated training data comprises a category for each of pixels comprised in a training image that is comprised in the fully-annotated simulated training data.

12. The computer-implemented method of claim 1, wherein the fully- annotated simulated training data comprises traffic accident images.

13. The computer-implemented method of claim 1, wherein the entity is the vehicle and the method further comprises controlling a feature of the vehicle selected from a group consisting of a vehicle speed, a vehicle braking, and vehicle steering, responsive to the dangerous condition being predicted.

14. The computer-implemented method of claim 1, wherein a number of training epochs in each of a plurality of policy iterations corresponding to said generating, training, and measuring steps is defined as a respective one of the computer-selected simulator- adjusting parameters.

15. The computer-implemented method of claim 1, wherein a dataset size in each of a plurality of policy iterations corresponding to said generating, training, and measuring steps is defined as a respective one of the computer-selected simulator-adjusting parameters.

16. The computer-implemented method of claim 1, further comprising selectively choosing between fine-tuning the computer-selected simulator-adjusting parameters and estimating the updated computer-selected simulator-adjusting parameters from the scratch using a random initialization.

17. A computer program product for danger prediction, the computer program product comprising a non-transitory computer readable storage medium having program instructions embodied therewith, the program instructions executable by a computer to cause the computer to perform a method comprising:
generating, by a hardware processor, fully-annotated simulated training data for a machine learning model responsive to receiving a set of computer-selected simulator-adjusting parameters, the fully-annotated simulated training data including a category for each of pixels included in training images included in the fully-annotated simulated training data;
training, by the hardware processor, the machine learning model using reinforcement learning on the fully-annotated simulated training data;
measuring, by the hardware processor, an accuracy of the trained machine learning model relative to learning a discriminative function for a given task, the discriminative function predicting a given label for a given image from the fully-annotated simulated training data;
adjusting, by the hardware processor, the computer-selected simulator-adjusting parameters and repeating said training and measuring steps responsive to the accuracy being below a threshold accuracy; and
predicting, by the hardware processor, a dangerous condition relative to a motor vehicle and providing a warning to an entity regarding the dangerous condition by applying the trained machine learning model to actual unlabeled data for the motor vehicle.

18. The computer program product of claim 17, wherein said adjusting step is skipped responsive to the accuracy being equal to or greater than a threshold accuracy.

19. The computer program product of claim 18, wherein a reward is provided responsive to the accuracy being equal to or greater than the threshold accuracy.

20. A computer processing system for determining command-to- process correspondence, comprising:
a memory device including program code stored thereon;
a hardware processor, operatively coupled to the memory device, and configured to run the program code stored on the memory device to
generate fully-annotated simulated training data for a machine learning model responsive to receiving a set of computer-selected simulator-adjusting parameters, the fully-annotated simulated training data including a category for each of pixels included in training images included in the fully-annotated simulated training data;
train the machine learning model using reinforcement learning on the fully- annotated simulated training data;
measure an accuracy of the trained machine learning model relative to learning a discriminative function for a given task, the discriminative function predicting a given label for a given image from the fully-annotated simulated training data;
adjust the computer-selected simulator-adjusting parameters and repeating said training and measuring steps responsive to the accuracy being below a threshold accuracy; and predict a dangerous condition relative to a motor vehicle and providing a warning to an entity regarding the dangerous condition by applying the trained machine learning model to actual unlabeled data for the motor vehicle.

* * * * *